(12) United States Patent
Sengodan

(10) Patent No.: US 10,868,468 B1
(45) Date of Patent: Dec. 15, 2020

(54) DC-DC CONVERTER FOR CURRENT CONTROLLED SOLENOID DRIVE

(71) Applicant: Hamilton Sundstrand Corporation, Charlotte, NC (US)

(72) Inventor: Rajkumar Sengodan, Tamilnadu (IN)

(73) Assignee: HAMILTON SUNSTRAND CORPORATION, Charlotte, NC (US)

(*) Notice: Subject to any disclaimer, the term of this patent is extended or adjusted under 35 U.S.C. 154(b) by 0 days.

(21) Appl. No.: 16/594,145

(22) Filed: Oct. 7, 2019

(30) Foreign Application Priority Data

Aug. 8, 2019 (IN) .............................. 201911032208

(51) Int. Cl.
*H02M 3/07* (2006.01)
*G11C 5/14* (2006.01)

(52) U.S. Cl.
CPC .............. *H02M 3/07* (2013.01); *G11C 5/145* (2013.01); *H02M 2003/075* (2013.01); *H02M 2003/077* (2013.01)

(58) Field of Classification Search
CPC ........ H01F 7/064; H01F 7/1805; H02M 3/07; H02M 3/073; H02M 2003/075; H02M 2003/0077; H02M 2003/073; H02M 2003/076; H02M 2003/072; G11C 5/145
USPC .......................................................... 327/536
See application file for complete search history.

(56) References Cited

U.S. PATENT DOCUMENTS 9,949,023 B2    4/2018  Astgimath et al.
2018/0302069 A1*  10/2018  Loke ........................ H03K 5/24

* cited by examiner

*Primary Examiner* — John W Poos
(74) *Attorney, Agent, or Firm* — Cantor Colburn LLP

(57) ABSTRACT

Provided are embodiments for a circuit including a DC-DC converter for current controlled solenoid drive, the circuit includes a constant current source; a charge pump circuit comprising a plurality of stages. Each stage includes a capacitor configured to be charged to a predetermined voltage; a current source operable to charge the capacitor; a switch; and a controller that is configured to control switching of the switch for each of the plurality of stages based at least in part on an output current of the charge pump. Also, provided are embodiments of a method for operating a DC-DC converter for current controlled solenoid drive.

18 Claims, 5 Drawing Sheets

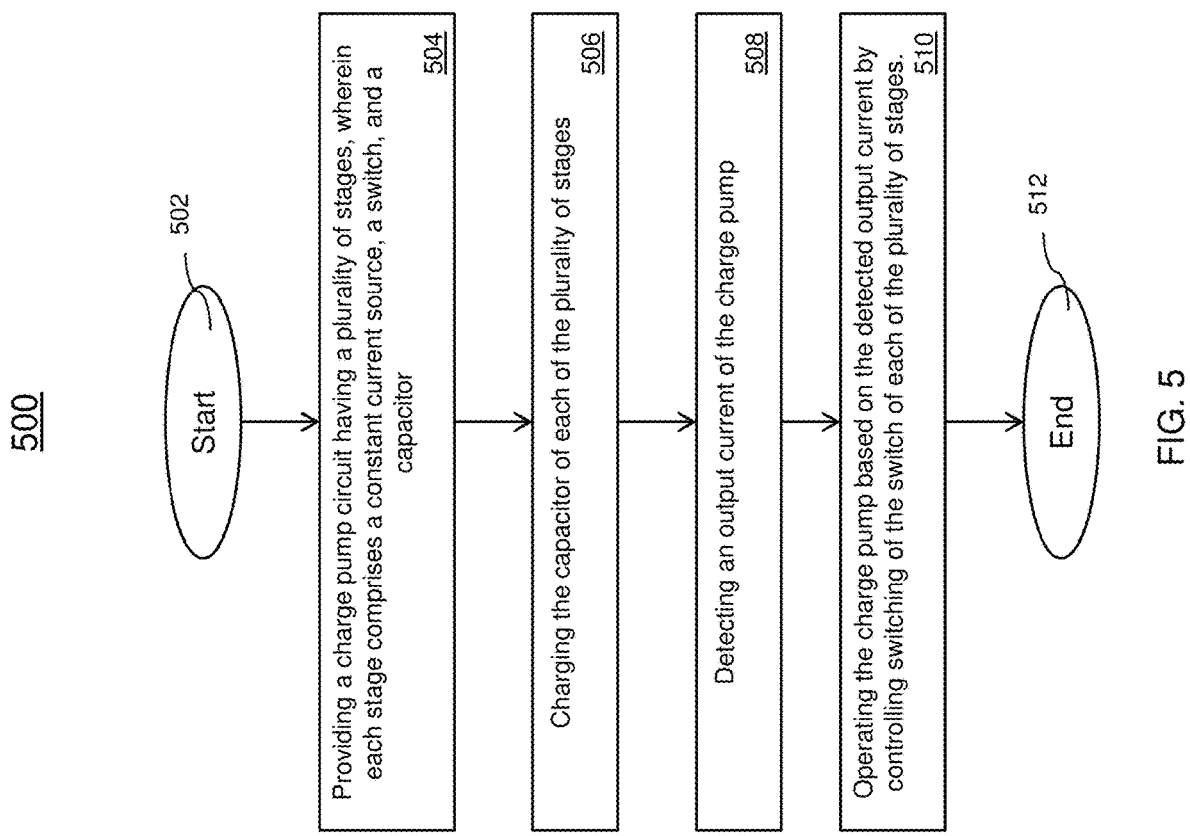

DC-DC CONVERTER FOR CURRENT CONTROLLED SOLENOID DRIVE

CROSS-REFERENCE TO RELATED APPLICATIONS

This application claims the benefit of Indian Application No. 201911032208 filed Aug. 8, 2019, which is incorporated herein by reference in its entirety.

BACKGROUND

The present invention generally relates to drive circuits, and more specifically to a system and method for operating a DC-DC converter for current controlled solenoid drive.

A solenoid is an electromechanical device that transduces or changes an electrical signal, which is input to the wire coil of the solenoid, into a corresponding mechanical movement of a metallic device, such as a rod, disposed within the coil. The electrical current flowing through the wire coil creates a magnetic field that either attracts or repels the metallic device. The metallic device is typically connected to a mechanical device, such as an actuator, which is physically moved along with the metallic device of the solenoid by the magnetic field.

Solenoids are commonly used in a wide range of both commercial and military devices. For example, solenoids are used on aircraft to control various mechanical devices and variables.

BRIEF DESCRIPTION

According to an embodiment, a method for operating a DC-DC converter for current controlled solenoid drive is provided. The method includes providing a charge pump circuit having a plurality of stages, wherein each stage includes a constant current source, a switch, and a capacitor; charging the capacitor of each of the plurality of stages; detecting an output current of the charge pump circuit; and operating the charge pump circuit based on the detected output current by controlling switching of the switch of each of the plurality of stages.

In addition to one or more of the features described herein, or as an alternative, further embodiments include increasing the switching frequency of the switch for each of the plurality of stages based on the detected output current.

In addition to one or more of the features described herein, or as an alternative, further embodiments include decreasing the switching frequency of the switch for each of the plurality of stages based on the detected output current.

In addition to one or more of the features described herein, or as an alternative, further embodiments include using a reference voltage and the capacitor voltage at each of the plurality of stages, wherein the comparison is used to charge the capacitor.

In addition to one or more of the features described herein, or as an alternative, further embodiments include independently charging each stage is controlled by the controller In addition to one or more of the features described herein, or as an alternative, further embodiments include using a comparison to deactivate the current source for each of the plurality of stages.

In addition to one or more of the features described herein, or as an alternative, further embodiments include performing temperature compensation using at least one of negative temperature coefficient (NTC) resistors or positive temperature coefficient (PTC) resistors.

In addition to one or more of the features described herein, or as an alternative, further embodiments include operating a pull-in and hold selection section to set a mode of operation for an actuator, wherein the mode is selected based on the logic controller.

In addition to one or more of the features described herein, or as an alternative, further embodiments include operating each current source of the plurality of stages as a current mirror, wherein the current is equal to or proportional to a reference current.

In addition to one or more of the features described herein, or as an alternative, further embodiments include coupling a voltage differential amplifier to the capacitor of the plurality of stages and providing the output to the comparator.

According to another embodiment, a system is provided that includes a constant current source, and a charge pump circuit including a plurality of stages. Each of the plurality of stages include a capacitor configured to be charged to a predetermined voltage; a current source operable to charge the capacitor; a switch; and a controller that is configured to control switching of the switch for each of the plurality of stages based at least in part on an output current of the charge pump.

In addition to one or more of the features described herein, or as an alternative, further embodiments include a comparator that is configured to compare a reference voltage and the capacitor voltage at each of the plurality of stages, wherein the comparison is used to charge the capacitor.

In addition to one or more of the features described herein, or as an alternative, further embodiments include a controller that is configured to adapt a reference current and the reference voltage of the comparator.

In addition to one or more of the features described herein, or as an alternative, further embodiments include a controller that is configured to increase the output current by increasing the reference voltage of the comparator and decrease the output current by decreasing the reference voltage of the comparator.

In addition to one or more of the features described herein, or as an alternative, further embodiments include a current source that is configured to independently charge each stage controlled by the controller if the reference voltage is not reached.

In addition to one or more of the features described herein, or as an alternative, further embodiments include using a comparison to deactivate the current source for each of the plurality of stages if the reference voltage is exceeded.

In addition to one or more of the features described herein, or as an alternative, further embodiments include performing temperature compensation using at least one of negative temperature coefficient (NTC) resistors or positive temperature coefficient (PTC) resistors.

In addition to one or more of the features described herein, or as an alternative, further embodiments include using a pull-in and hold selection section that is configured to set a mode of operation for an actuator, wherein the mode is selected based on the controller.

In addition to one or more of the features described herein, or as an alternative, further embodiments include operating each current source of the plurality of stages as a current mirror, wherein a current for each of the plurality of stages is equal to or proportional to a reference current.

In addition to one or more of the features described herein, or as an alternative, further embodiments include a voltage differential amplifier that is coupled to the capacitor of the plurality of stages and provide the output to the comparator.

The foregoing features and elements may be combined in various combinations without exclusivity, unless expressly indicated otherwise. These features and elements as well as the operation thereof will become more apparent in light of the following description and the accompanying drawings. It should be understood, however, that the following description and drawings are intended to be illustrative and explanatory in nature and non-limiting.

BRIEF DESCRIPTION OF THE DRAWINGS

The subject matter which is regarded as the present disclosure is particularly pointed out and distinctly claimed in the claims at the conclusion of the specification. The foregoing and other features, and advantages of the present disclosure are apparent from the following detailed description taken in conjunction with the accompanying drawings in which:

FIG. 5 depicts a flowchart of a method DC-DC converter for current controlled solenoid drive.

DETAILED DESCRIPTION

In mass production of solenoid apparatuses there is a possibility at some point the solenoid electrical parameters can vary with respect to temperatures. This can lead to non-linear working of the solenoid for the applied voltage during the pull-in and hold period. Such an abnormal operation can cause the control device failure or a safety hazard in safety-critical applications.

In addition, an event may occur where a particular solenoid is selected but the available supply rail voltage is too high or too low. For example, a coil is rated for 12 V but the supply rail is 24 V. While a solution is to simply switch to a solenoid with a 24 V coil, doing so can lead to additional complications. Switching components can involve a difficult and lengthy process. In another scenario, the design can require the specification of a particular solenoid, however, it is rated for 12 V but you have a 24 V rail supply.

The techniques described herein regulate the current to the required value independent of the coil resistance which makes the system more robust over the temperature. In addition, the techniques described herein eliminate potential hazards and efficient operation for various actuator applications. The techniques described herein do not limit the actuator module and can be applied to any load by adjusting the voltage and current controls.

Figure 1:
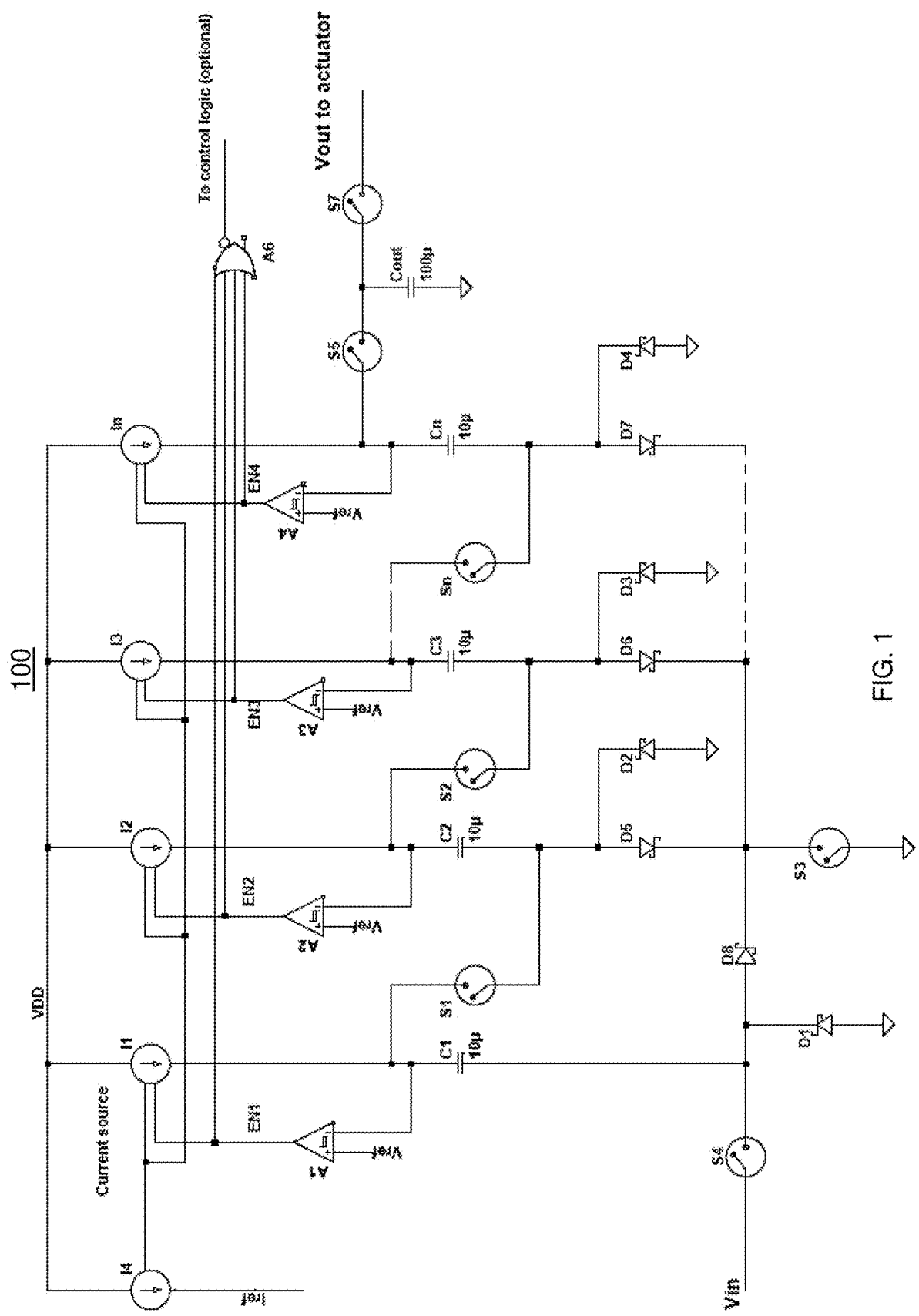
FIG. 1 depicts a DC-DC converter circuit in accordance with one or more embodiments.

FIG. 1 depicts a current controlled solenoid drive in accordance with one or more embodiments. FIG. 1 includes a constant current source I4 which provides reference current Iref. In this non-limiting example, there are 4 stages of the charge pump circuit where each stage comprises a current source, a capacitor, a switch, and a comparator.

FIG. 1 depicts comparators A1, A2, A3, A4 are implemented for each capacitor C1, C2, C3, Cn in order to precisely limit the charging time constant. In turn, each distinct comparator A1, A2, A3, A4 works efficiently for aging capacitors, tolerances, and environmental factors. The output of each of the comparators A1, A2, A3, A4 is provided to a control logic controller (not shown). In one or more embodiments, the output of the comparators A1, A2, A3, A4 is provided to a NOR logic gate A6 to provide feedback to a control logic controller such as a microcontroller to initiate the discharge of the capacitors. In a non-limiting example, all comparators A1, A2, A3, A4 output goes logic LOW then the NOR gate A6 output goes logic HIGH and is provided to the microcontroller. Further, the comparator output will deactivate the current sources I1, I2, I3, I4 once the capacitor reaches a specified voltage level.

FIG. 1 also depicts switching control elements S1, S2, S3 . . . Sn (switches) to generate the voltage magnitude required to drive the output load or actuator in this example. The switches S1, S2, S3 . . . Sn can be realized as a field-effect transistor (PET), either PMOS or NMOS. In one or more embodiments, the switching period is controlled in-order to regulate the current across the load based on the current source Iref. Each stage of the charge pump circuit includes a current source I1, I2, I3, I4 to enable the efficient charge of each of the capacitors using the constant current source. Thus, the charge on each of the capacitors and consequently, the voltage across each of the capacitors can be accurately controlled. A supply voltage VDD is provided with high accuracy by adding the voltage across the capacitors C1, C2, C3, Cn at each stage. In one or more embodiments, the charge pump circuit operates such that its frequency of operation depends on an output current Cout. The output current Cout depends on the charging time of the charge pump circuit.

The switching frequency is controlled to provide the current at the output. The frequency can be increased for delivering more current to the load and decreased for less current requirements. The controller is configured to receive the comparator output which deactivates the current source once the capacitor reaches a specified voltage level.

FIG. 1 depicts diodes D1, D2, D3, D4 which are required for the discharge phase. In one or more embodiments the diodes are Schottky diodes and have a very low voltage drop. Therefore, there is minimal impact to the capacitor charge voltage where I1, I2, I3, I4 are constant current sources. The discharging phase follows the path Vin>C1>S1>C2>S2>C3>S6>C4>S5 through the charge pump circuit. The output voltage, Cout=Vin+C1+C2+C3+C4, where the output voltage is used to drive the actuator. The output capacitor Cout can be included in the arrangement to average the switching voltage to provide less ripple content output to the actuator for precise current control. In an alternative embodiment, if the actuator drive requires a pulsated voltage with a fixed duty cycle then Cout can be disconnected from the network.

FIG. 1 also depicts diodes D5, D6, D7, D8 which are required during the charging phase of the charge pump circuit. During the charging phase of the capacitors, each stage follows the following paths respectively:

Path1: I1>C1>D8>S3
Path2: I2>C2>D5>S3
Path3: I3>C3>D6>S3
Path4: I4>C4>D7>S3

Figure 2:
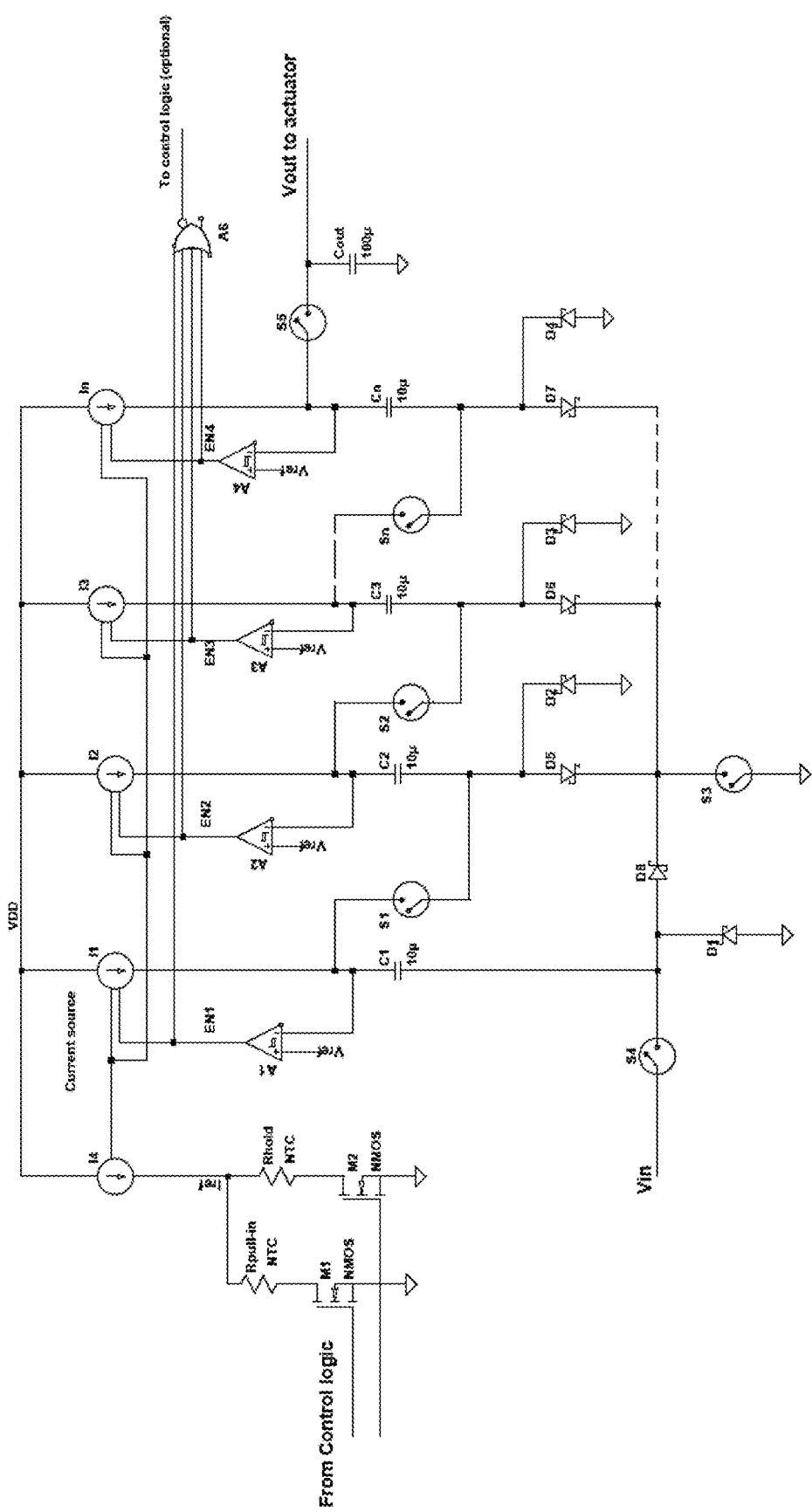
FIG. 2 depicts a DC-DC converter circuit including for a current controlled solenoid drive with pull-in and hold current selection in accordance with one or more embodiments.

FIG. 2 depicts a current controlled solenoid drive 200 with pull-in and hold current selection. The pull-in and hold selection section (Rpull-in, M1, Rhold, M2) with negative temperature coefficient (NTC) resistor is added in order to provide predefined pull-in and hold reference current. This in-turn will provide reduced overhead on the controller for the pull-in and hold current selection mode. The NTC or PTC (positive temperature coefficient) resistors are used for automatic tuning with respect to temperature variation of the circuit and actuator load characteristics.

During the pull-in period for the solenoid, the current required is high and requires high switching frequency to store energy in capacitor Cout and switch S7 provides required power for the load drive. Further high switching frequencies can introduce switching loss across the switches. Therefore, in order to have constant switching in both the pull-in and hold period, the resistor arrangement would ease control logic configuration. In this configuration, the constant switching control circuit can be an a stable multivibrator and ensure that bandwidth for charging all the capacitor will within the ON period of switch S3. In another embodiment, a microcontroller can be employed to ease the control logic configuration.

Figure 3:
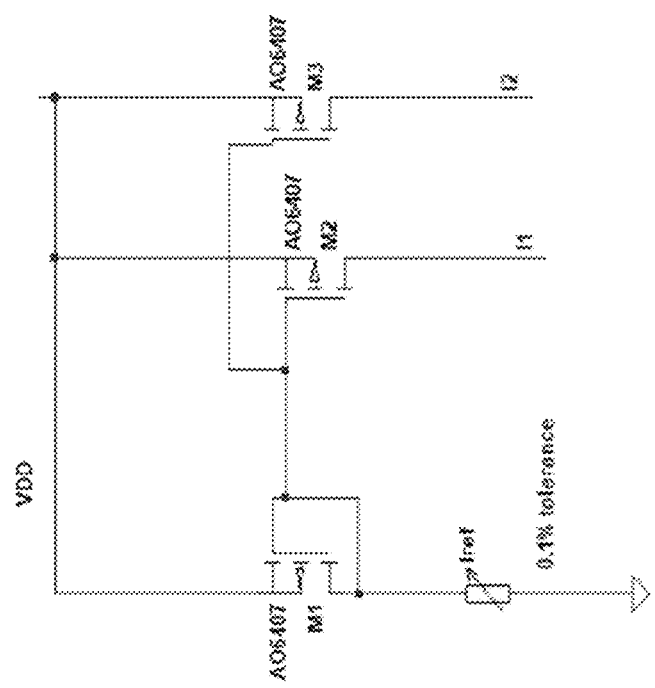
FIG. 3 depicts a constant current source with digiPOT configuration.

FIG. 3 depicts a digiPOT configuration 300 that can be coupled to the system such as that shown in FIG. 1. In one or more embodiments the constant current source can be varied by adjusting an Iref resistor by digitally controlling means such as the digiPOT. This allows the system to automatically adjust the current required to compensate for tolerances of electronic components due to environmental disturbances and provides a more accurate drive.

Figure 4:
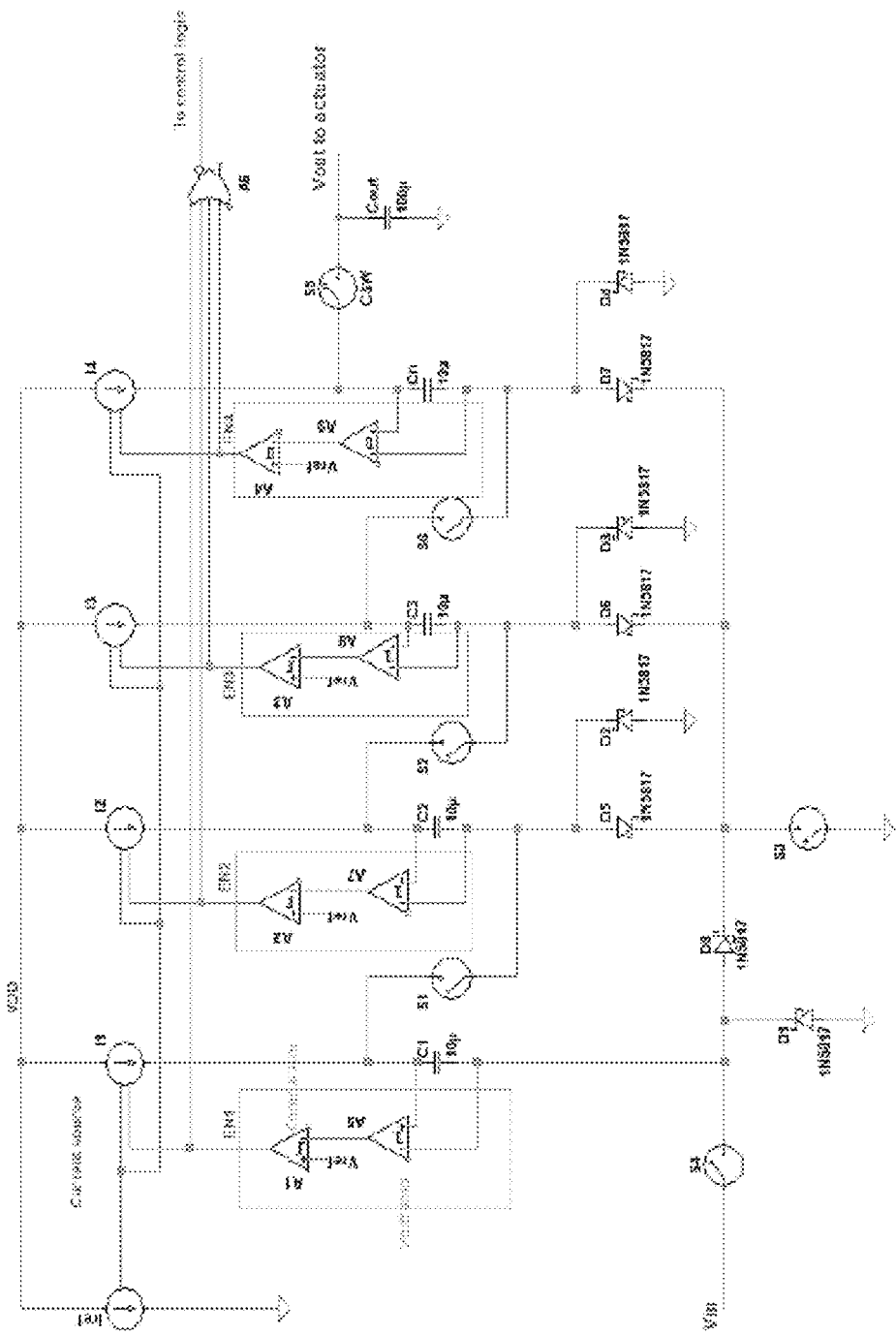
FIG. 4 depicts a voltage difference amplifier and comparator arrangement in accordance with one or more embodiments.

Now referring to FIG. 4, a voltage difference amplifier and comparator arrangement is provided. As shown, voltage difference amplifiers A5, A6, A8, A9 are positioned across the respective capacitors C1, C2, C3, Cn. The output of the voltage difference amplifier is provided to the respective comparators A1, A2, A3, A4 which compare the output with the reference voltage Vref. The output of the comparator is provided to the controller to determine the switching of the switches to achieve the desired output of the system.

Now referring to FIG. 5, a flowchart of a method 500 for operating a DC-DC converter for current controlled solenoid drive is provided. The method 500 begins at block 502 and continues to block 504 which provides for providing a charge pump circuit having a plurality of stages, wherein each stage includes a constant current source, a switch, and a capacitor. Block 506 provides for charging the capacitor of each of the plurality of stages. The capacitors of each stage are charged which receives current from the constant current source for each stage. The capacitors are charged to a predetermined voltage. The voltage of the capacitor is compared to a reference voltage to determine whether the capacitor should continue to be charged by the constant current source or charging should be discontinued.

Block 508 detects an output current of the charge pump circuit. Block 510 operates the charge pump circuit based on the detected output current by controlling a reference current Iref through digiPOT and Vref of the comparators A1, A2, A3, A4 of each of the plurality of stages. In an embodiment, the controller increases the Vref of the comparator A1, A2, A3, A4 to increase the output current provided to the load. In another embodiment, the controller decreases the Vref of the comparator A1, A2, A3, A4 to decrease the output current provided to the load.

The technical effects and benefits include a simple design having fewer switching elements resulting in a reduction in switching losses and complexity in the control logic. The technical effects and benefits also include a reduced EMI effects due to charge pump topology as compared to inductive boost drive. The technical effects and benefits include efficient control of a multiple capacitor array configuration due to the simple charge pump design. The technical effects and benefits include less switches required than conventional charge pump designs.

While the present disclosure has been described in detail in connection with only a limited number of embodiments, it should be readily understood that the present disclosure is not limited to such disclosed embodiments. Rather, the present disclosure can be modified to incorporate any number of variations, alterations, substitutions or equivalent arrangements not heretofore described, but which are commensurate with the spirit and scope of the present disclosure. Additionally, while various embodiments of the present disclosure have been described, it is to be understood that aspects of the present disclosure may include only some of the described embodiments. Accordingly, the present disclosure is not to be seen as limited by the foregoing description, but is only limited by the scope of the appended claims.

The invention claimed is:

1. A method comprising:
providing a charge pump circuit having a plurality of stages, wherein each stage includes a constant current source, a switch, and a capacitor;
charging the capacitor of each of the plurality of stages;
detecting an output current of the charge pump circuit;
operating the charge pump circuit based on the detected output current by controlling switching of the switch of each of the plurality of stages; and
comparing, a reference voltage and the capacitor voltage, at each of the plurality of stages, wherein the comparison is used to charge the capacitor.

2. The method of claim 1, further comprising increasing switching frequency of the switch for each of the plurality of stages based on the detected output current.

3. The method of claim 1, further comprising decreasing switching frequency of the switch for each of the plurality of stages based on the detected output current.

4. The method of claim 1, further comprising independently charging each stage controlled by the controller.

5. The method of claim 1, wherein the comparison deactivates the current source for each of the plurality of stages.

6. The method of claim 1, further comprising performing temperature compensation using at least one of negative temperature coefficient (NTC) resistors or positive temperature coefficient (PTC) resistors.

7. The method of claim 1, further comprising operating a pull-in and hold selection section to set a mode of operation for an actuator, wherein the mode is selected based on the logic controller.

8. The method of claim 1, further comprising operating each current source of the plurality of stages as a current mirror, wherein the current is equal to or proportional to a reference current.

9. The method of claim 1, further comprising coupling a voltage differential amplifier to the capacitor of the plurality of stages and providing the output to the comparator.

10. A system comprising:
a constant current source;
a charge pump circuit comprising a plurality of stages, wherein each stage comprises:
a capacitor configured to be charged to a predetermined voltage;
a current source operable to charge the capacitor; and
a switch;

a controller configured to control switching of the switch for each of the plurality of stages based at least in part on an output current of the charge pump; and a comparator that is configured to compare a reference voltage and the capacitor voltage at each of the plurality of stages, wherein the comparison is used to charge the capacitor.

11. The system of claim 10, wherein the controller is configured to adapt a reference current and the reference voltage of the comparator.

12. The system of claim 11, wherein the controller is configured to increase the output current by increasing the reference voltage of the comparator and decrease the output current by decreasing the reference voltage of the comparator.

13. The system of claim 10, wherein the current source is configured to independently charge each stage controlled by the controller if the reference voltage is not reached.

14. The system of claim 10, wherein the comparison deactivates the current source for each of the plurality of stages if the reference voltage is exceeded.

15. The system of claim 10, further comprising performing temperature compensation using at least one of negative temperature coefficient (NTC) resistors or positive temperature coefficient (PTC) resistors.

16. The system of claim 10, further comprising a pull-in and hold selection section configured to set a mode of operation for an actuator, wherein the mode is selected based on the controller.

17. The system of claim 10, further comprising operating each current source of the plurality of stages as a current mirror, wherein a current for each of the plurality of stages is equal to or proportional to a reference current.

18. The system of claim 10, further comprising a voltage differential amplifier coupled to the capacitor of the plurality of stages and providing the output to the comparator.

* * * * *